(12) United States Patent
Tien

(10) Patent No.: US 9,949,391 B2
(45) Date of Patent: Apr. 17, 2018

(54) PROTECTIVE SHELL

(71) Applicant: HON HAI PRECISION INDUSTRY CO., LTD., New Taipei (TW)

(72) Inventor: Li-Wen Tien, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 136 days.

(21) Appl. No.: 14/717,505

(22) Filed: May 20, 2015

(65) Prior Publication Data

US 2016/0052675 A1 Feb. 25, 2016

(30) Foreign Application Priority Data

Aug. 25, 2014 (CN) .......................... 2014 1 0420400

(51) Int. Cl.
*B65D 5/52* (2006.01)
*H05K 5/02* (2006.01)
*G06F 1/16* (2006.01)

(52) U.S. Cl.
CPC ......... *H05K 5/0234* (2013.01); *G06F 1/1626* (2013.01); *G06F 2200/1633* (2013.01)

(58) Field of Classification Search
CPC ...... B65D 5/5306; B65D 25/24; B65D 25/22; B65D 5/52; B65D 5/5213; H05K 5/0234; G06F 1/1626; G06F 2200/1633; F16M 11/10; F16M 13/00; H04M 1/04; H04M 1/0214
USPC ...... 206/45.2, 755, 756, 759, 762, 764, 754, 206/752, 751, 45.23; 439/527; 248/351; 312/326; 220/737, 631, 629, 628
See application file for complete search history.

(56) References Cited

U.S. PATENT DOCUMENTS

| 5,280,135 A * | 1/1994 | Berlin ............... H02G 3/14 174/67 |
| 7,715,186 B2 * | 5/2010 | Kuo ................. G06F 1/1616 312/223.1 |
| 2012/0325986 A1 * | 12/2012 | Chen ................. F16M 11/10 248/122.1 |
| 2013/0334070 A1 * | 12/2013 | Adelman ........... A45F 5/00 206/37 |
| 2014/0078671 A1 * | 3/2014 | Hong ................ H04B 1/3888 361/679.56 |

FOREIGN PATENT DOCUMENTS

| CN | 103843311 A | 6/2014 |
| TW | 201302020 A1 | 1/2013 |

* cited by examiner

*Primary Examiner* — Anthony Stashick
*Assistant Examiner* — James M Van Buskirk
(74) *Attorney, Agent, or Firm* — ScienBiziP, P.C.

(57) ABSTRACT

A protective shell includes a casing and a rotating assembly. The casing supports an electronic device. The casing includes a first portion and a second portion. The first portion includes a first joining end, and the second portion includes a second joining end. The rotating assembly includes a shaft and a hook. The shaft protrudes from the first portion adjacent to the first joining end and extends along the first joining end. The hook protrudes from the second joining end and bends toward the second portion. The second portion is rotatably connected to the first portion when the hook is hooked on the shaft. The second portion is positioned at any position relative to the first portion, and the second portion forms any desired angle with the first portion to prop up the first portion and the electronic device.

9 Claims, 4 Drawing Sheets

PROTECTIVE SHELL

CROSS-REFERENCE TO RELATED APPLICATIONS

This application claims priority to Chinese Patent Application No. 201410420400.8 filed on Aug. 25, 2014, the contents of which are incorporated by reference herein.

FIELD

The subject matter herein generally relates to protective shells, and particularly, to a protective shell capable of protecting and supporting an electronic device.

BACKGROUND

Protective shells are commonly used to protect the electronic devices from shock. However, most protective shells cannot prop the electronic devices up for easy viewing.

BRIEF DESCRIPTION OF THE DRAWINGS

Implementations of the present technology will now be described, by way of example only, with reference to the attached figures, wherein.

DETAILED DESCRIPTION

Figure 1:
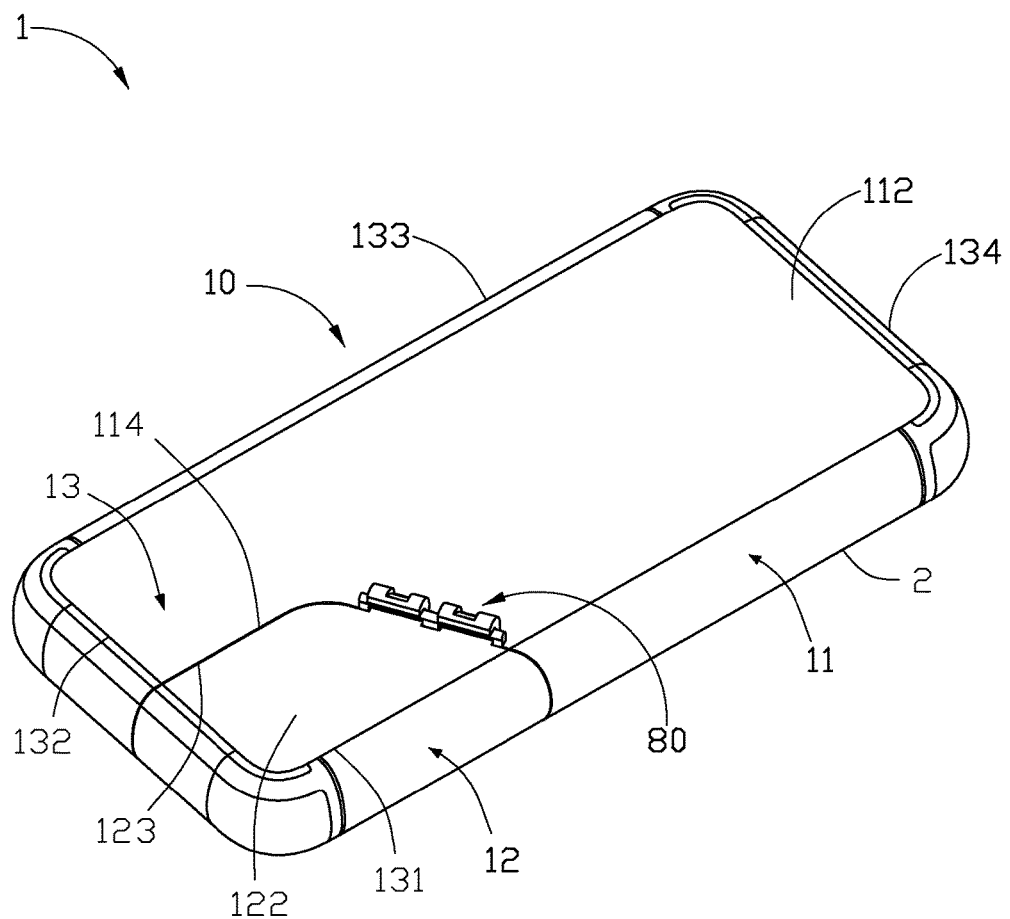
FIG. 1 is an isometric view showing an embodiment of a protective shell receiving an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

In general, the term "comprising" means "including, but not necessarily limited to"; it specifically indicates open-ended inclusion or membership in a so-described combination, group, series and the like.

Embodiments of the present disclosure will be described with reference to the accompanying drawings.

FIG. 1 illustrates an isometric view of an embodiment of a protective shell 1 receiving an electronic device 2. The protective shell 1 can protect the electronic device 2 and support the electronic device 2. In the embodiment, the protective shell 1 can receive the electronic device 2. In other embodiments, the electronic device 2 can be suctioned to the protective shell 1 via a suction cup or be detachably coupled to the protective shell 1 via other suitable ways. In the embodiment, the electronic device 2 can be a smart phone, an e-book, a digital photo frame, and the like. The protective shell 1 can include a casing 10 and a positioning assembly 80. The casing 10 can include a first portion 11 and a second portion 12. The positioning assembly 80 can be configured to connect the first portion 11 to the second portion 12 and position the first portion 11 relative to the second portion 12.

In the embodiment, a shape of the casing 10 can be matched with a shape of the electronic device 2, and the shape of the casing 10 can be cuboid, cube, cylinder, triangular prism, polyhedron, or other suitable shapes according to the shape of the electronic device 2.

In the embodiment, the casing 10 can include a plate 13. The plate 13 can include four side edges, respectively, a first side edge 131, a second side edge 132, a third side edge 133, and a fourth side edge 134. The first side edge 131 can be opposite to the third side edge 133. The first side edge 131 can be adjacent and connected to the second side edge 132 and the fourth side edge 134, and the third side edge 133 can be adjacent and connected to the second side edge 132 and the fourth side edge 134. The second side edge 132 can be opposite to the fourth side edge 134.

In the embodiment, the first portion 11 can include a first surface 111 (see FIG. 3) and a second surface 112. In the embodiment, the first surface 111 of the first portion 11 can be an upper surface of the first portion 11, and the second surface 112 of the first portion 11 can be a lower surface of the first portion 11. In the embodiment, the first portion 11 can further define at least one receiving slot 113 (see FIG. 2). In the embodiment, two receiving slots 113 can be taken as an example. In the embodiment, the second portion 12 can include a first surface 121 (see FIG. 4) and a second surface 122. In the embodiment, the first surface 121 of the second portion 12 can be an upper surface of the second portion 12, and the second surface 122 of the second portion 12 can be a lower surface of the second portion 12.

In the embodiment, the casing 10 can be cut into the first portion 11 and the second portion 12. In the embodiment, the second portion 12, which is formed by two adjacent side edges, can be cut off from a corner of the casing 10, for example, the first side edge 131 and the second side edge 132, thus the second portion 12 can be a corner of the casing 10. In an alternative embodiment, the second portion 12 can be cut off from the casing 10 from one side edge toward an opposite side edge, such as from the first side edge 131 toward the third side edge 133, thus the second portion 12 can be an upper intermediate portion of the casing 10, a lower intermediate portion of the casing 10, a left intermediate portion of the casing 10, or a right intermediate portion of the casing 10. In other embodiments, the second portion 12 can be cut off from the casing 10 from an intermediate portion of the casing 10 toward one of the four side edges, such as from the intermediate portion of the casing 10 toward the first side edge 131, thus the second portion 12 can be an intermediate portion of the casing 10. In the embodiment, the first portion 11 can include a first joining end 114. The second portion 12 can include a second joining end 123. The casing 10 can be cut into the first portion 11 and the second portion 12 from the first joining end 114 and the second joining end 123.

In other embodiments, the first portion 11 and the second portion 12 can be respectively independently formed. The first portion 11 can include another first joining end 114, and the second portion 12 can include another second joining end 123. A shape of the first joining end 114 can match a shape of the second joining end 123. The first portion 11 can cooperate with the second portion 12 to form the casing 10 which is integrated when the first joining end 114 is jointed with the second joining end 123. In the embodiment, when the first portion 11 and the second portion 12 cooperatively form the casing 10, the angle between the first portion 11 and the second portion 12 can be 180 degrees. The first joining end 114 and the second joining end 123 can extend from one side edge of the casing 10 toward an adjacent side edge of the casing 10, from one side edge toward an opposite side edge, or from an intermediate portion of the casing 10 toward one of the four side edges.

Figure 2:
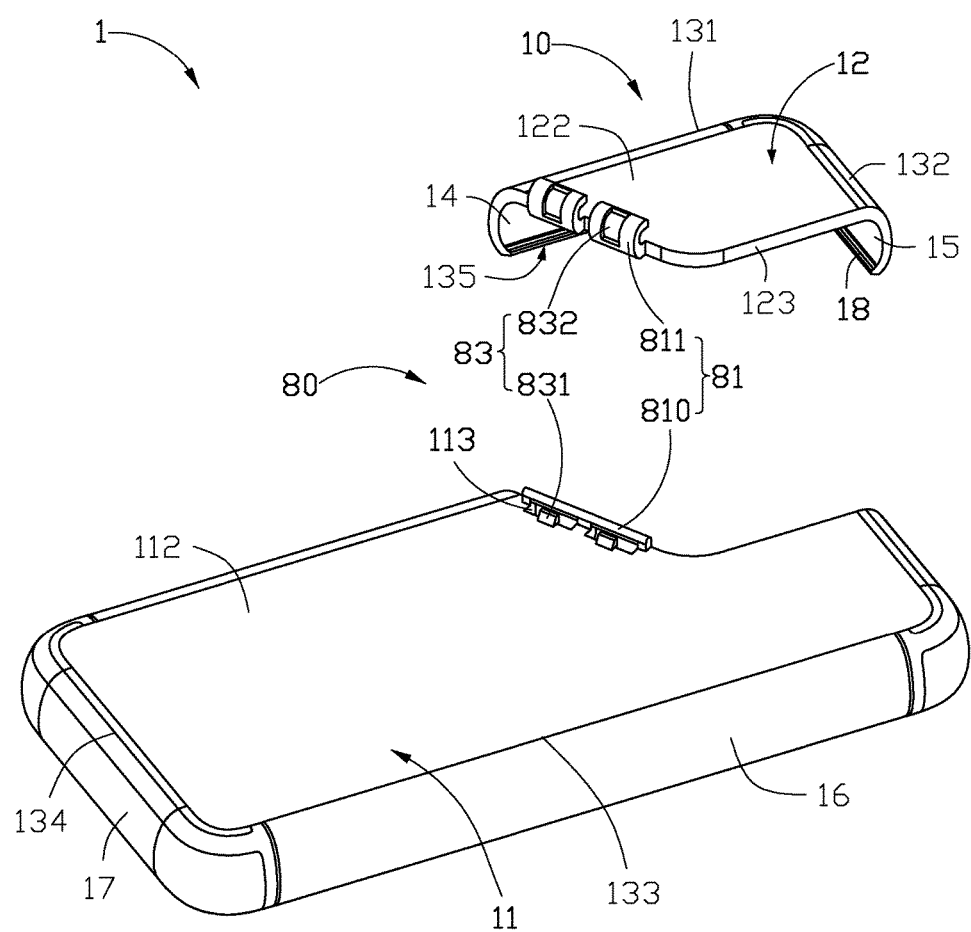
FIG. 2 illustrates an exploded, isometric view showing the protective shell of FIG. 1.

FIG. 2 illustrates an exploded, isometric view of the protective shell. In the embodiment, the positioning assembly 80 can include a rotating assembly 81 and a latching assembly 83. In the embodiment, the rotating assembly 81 can include a shaft 810 and at least one hook 811. In other embodiments, the shaft 810 can be divided into two sub-shafts whose total length is equal to a length of the shaft 810. In the embodiment, two hooks 811 can be taken as an example. In the embodiment, the latching assembly 83 can include at least one latching member 831 and at least one guiding slot 832. In the embodiment, two latching members 831 can be taken as an example, and two guiding slots 832 can be taken as an example. In the embodiment, the shaft 810 and the latching members 831 can protrude from the second surface 112 of the first portion 11 and extend along the first joining end 114. In the embodiment, the receiving slots 113 can extend along a same direction as the shaft 810. In the embodiment, the shaft 810 and the latching members 831 can be distributed on two opposite sides of the receiving slots 113. The shaft 810 can be adjacent to the first joining end 114 with respect to the latching members 831.

In the embodiment, each hook 811 can protrude from the second joining end 123 facing away from the first surface 121 of the second portion 12 and bend toward the second surface 122 of the second portion 12. In the embodiment, each hook 811 can pass through a corresponding receiving slot 113 and be rotatably hooked on the shaft 810 to connect the second portion 12 to the first portion 11. In the embodiment, each hook 811 can define a corresponding guiding slot 832. In the embodiment, each guiding slot 832 can extend along a bending direction of a corresponding hook 811. In the embodiment, each latching member 831 can be movably received in a corresponding guiding slot 832 and can move along the corresponding guiding slot 832. In the embodiment, a width of each latching member 831 can be a same as a width of the corresponding guiding slot 832. Thus, when the latching members 831 are received in the guiding slots 832, the position between the first portion 11 and the second portion 12 can be fixed.

In the embodiment, the electronic device 2 can be connected to the casing 10 at the first surface 111 (see FIG. 4) of the first portion 11 and the first surface 121 (see FIG. 4) of the second portion 12. In the embodiment, the casing 10 can further include at least four sidewalls, respectively, a first sidewall 14, a second sidewall 15, a third sidewall 16, and a fourth sidewall 17. The first sidewall 14, the second sidewall 15, the third sidewall 16, and the fourth sidewall 17 can respectively protrude from the first side edge 131 of the plate 13, the second side edge 132 of the plate 13, the third side edge 133 of the plate 13, and the fourth side edge 134 of the plate 13 at a same surface and facing away from the second surface 112 of the first portion 11 and the second surface 122 of the second portion 12. The plate 13 can cooperate with the first sidewall 14, the second sidewall 15, the third sidewall 16, and the fourth sidewall 17 to form a receiving space 135. The receiving space 135 can be configured to receive the electronic device 2. In other embodiments, the plate 13 can define a receiving space to receive the electronic device 2. The receiving space can extend from the first surface 111 of the first portion 11 to the second surface 112 of the first portion 11.

In the embodiment, the casing 10 can further include a frame 18. The frame 18 can surround the receiving space 135 and bend toward the receiving space 135. The frame 18 can be configured to prevent the electronic device 2 from disengaging from the receiving space 135.

To assemble the casing 10, the hooks 811 can pass through the receiving slots 113 and be hooked on the shaft 810 to connect the second portion 12 to the first portion 11. The first joining end 114 can be jointed with the second joining end 123, causing the first portion 11 and the second portion 12 to cooperatively form the casing 10. The latching members 831 can be received in the guiding slots 832 to fix the position between the first portion 11 and the second portion 12. The electronic device 2 can be placed into the receiving space 135, thus the first portion 11 and the second portion 12 can cooperatively protect the electronic device 2 from shock.

To support the electronic device 2, the second portion 12 can be pushed to cause the electronic device 2 to disengage from the frame 18 of the second portion 12, and pushed to rotate relative to the first portion 11. The hooks 811 can be brought by the second portion 12 to rotate relative to shaft 810. The latching members 831 can move along the guiding slots 832 until the force exerted on the second portion 12 is abated. The second portion 12 can form a desired angle with the first portion 11, and the position between the second portion 12 and the first portion 11 can be fixed. Thus, the second portion 12 can prop up the first portion 11 and the electronic device 2.

In other embodiments, the latching assembly 83 can be omitted, namely, the positioning assembly 80 can include the rotating assembly 81 rather than the rotating assembly 81 and the latching assembly 83. In the embodiment, when the hooks 811 are hooked on the shaft 810, a friction is formed between the hooks 811 and the shaft 810 when the hooks 811 rotate related to the shaft 810. The friction resists relative motion between the hooks 811 and the shaft 810. In the embodiment, the friction can be greater than or equal to a gravity of the first portion 11 and the electronic device 2. Thus, the second portion 12 can be positioned at any position relative to the first portion 11 via the friction between the hooks 811 and the shaft 810, and the second portion 12 can form any desired angle with the first portion 11 to prop up the first portion 11 and the electronic device 2 via the friction between the hooks 811 and the shaft 810.

Figure 3:
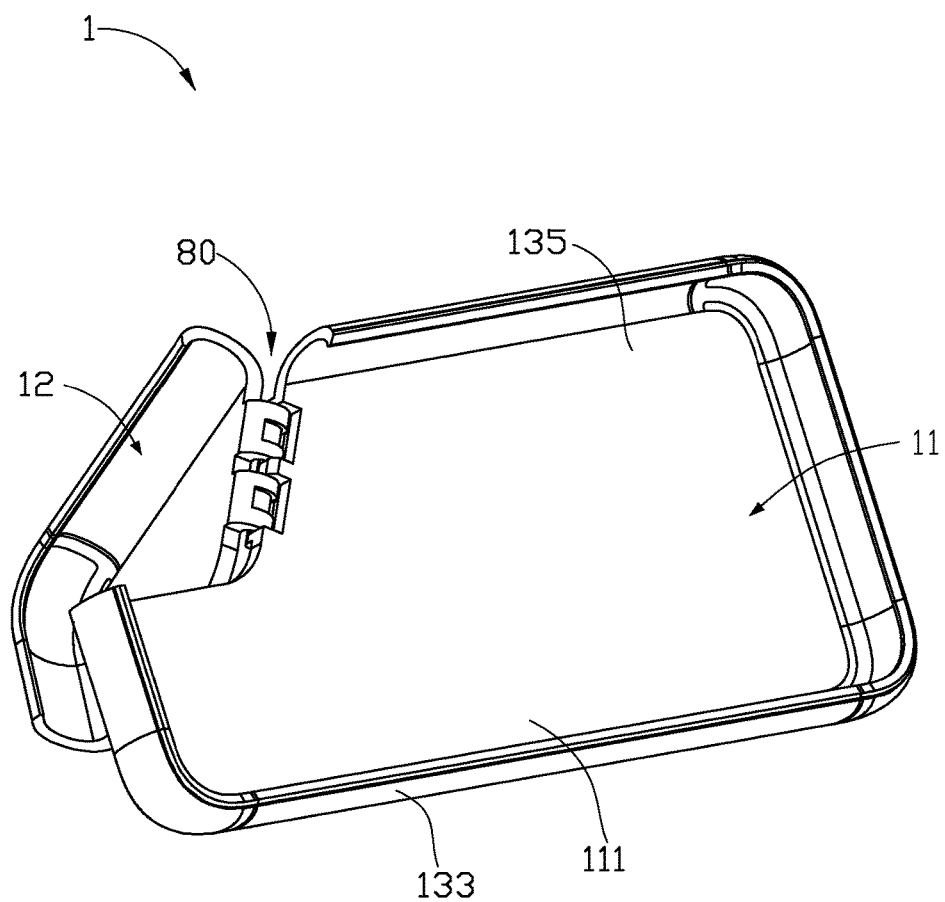
FIG. 3 illustrates the protective shell of FIG. 1 in a landscape state.
Figure 4:
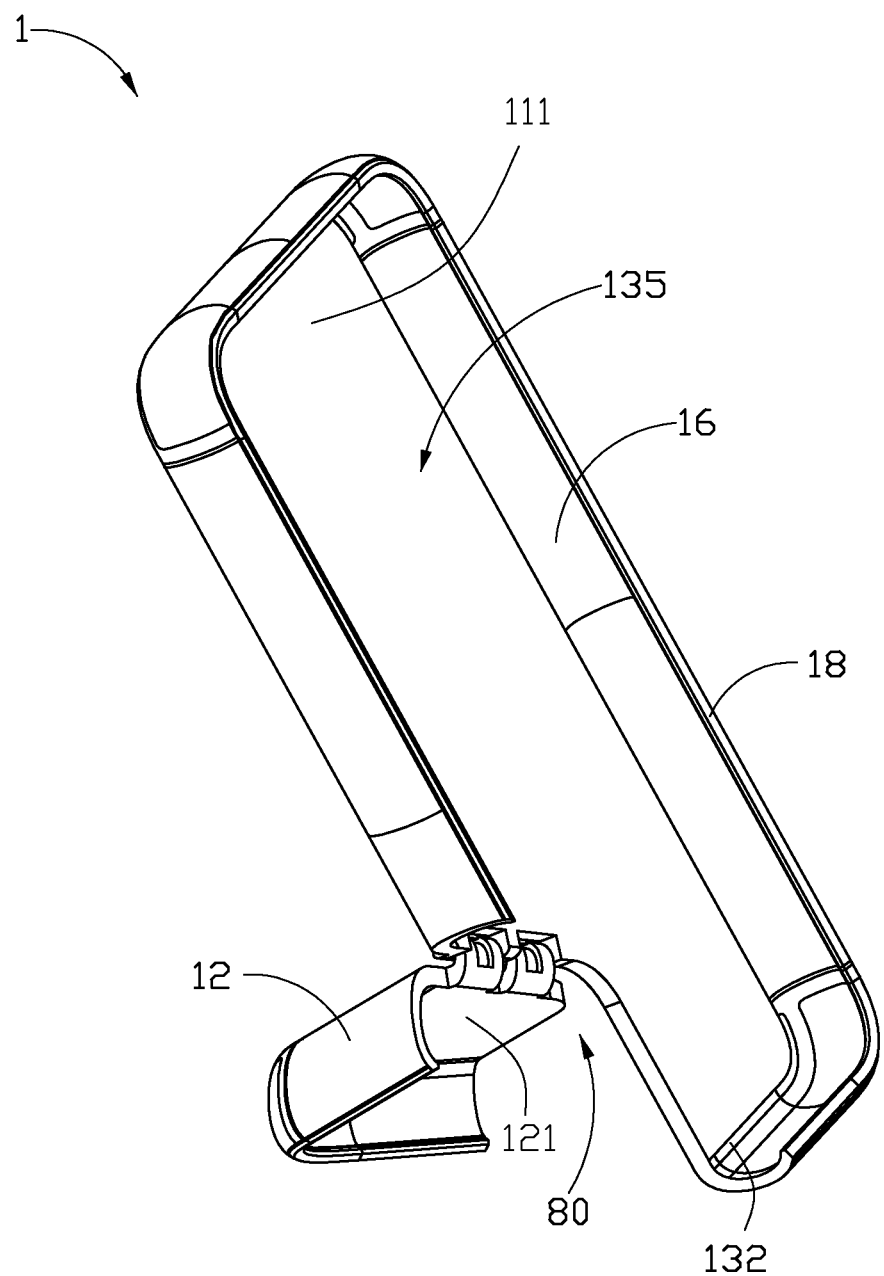
FIG. 4 illustrates the protective shell of FIG. 1 in a portrait state.

FIG. 3 shows an embodiment of the second portion 12 in a landscape state. When the second portion 12 is in a landscape state, the second portion 12 can cooperate with the third side edge 133 to prop up the electronic device 2 (see FIG. 1) in a landscape orientation. FIG. 4 shows an embodiment of the second portion 12 in a portrait state. When the second portion 12 is in a portrait state, the second portion 12 can cooperate with the second side edge 132 to prop up the electronic device 2 (see FIG. 1) in a portrait orientation.

The embodiments shown and described above are only examples. Even though numerous characteristics and advantages of the present technology have been set forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims.

What is claimed is:

1. A protective shell comprising:
a casing configured to support an electronic device, a first portion of the casing comprising a first joining end, and a second portion of the casing comprising a second joining end; and
a rotating assembly comprising:
at least one shaft protruding from the first portion adjacent to the first joining end and extending along the first joining end; and
at least one hook protruding from the second joining end and bent toward the second portion;
a latching assembly comprising:
at least one latching member, the at least one latching member protruding from the first portion; and
at least one guiding slot, the at least one hook defining the at least one guiding slot, the at least one guiding slot extending along a bending direction of the at least one hook;
wherein the at least one latching member is slidably received in the at least one guiding slot to position the second portion relative to the first portion;
wherein the second portion is rotatably connected to the first portion when the at least one hook is hooked on the at least one shaft and is positioned at any position relative to the first portion, so that the second portion forms an angle with the first portion to prop up the first portion and the electronic device;
wherein:
the first portion defines at least one receiving slot extending along the first joining end, the at least one shaft and the at least one latching member are distributed on two opposite sides of the at least one receiving slot;
the at least one shaft is adjacent to the first joining end with respect to the at least one latching member; and
the at least one hook passes through the at least one receiving slot and is rotatably hooked on the at least one shaft to connect the second portion to the first portion.

2. The protective shell as described in claim 1, wherein:
a friction is formed between the at least one hook and the at least one shaft, the friction is greater than or equal to a gravity of the at least one hook and the at least one shaft;
the second portion is positioned at any position relative to the first portion via the friction between the at least one hook and the at least one shaft; and
the second portion forms any desired angle with the first portion to prop up the first portion and the electronic device via the friction between the at least one hook and the at least one shaft.

3. The protective shell as described in claim 1, wherein a width of the at least one latching member is the same as a width of the at least one guiding slot.

4. The protective shell as described in claim 1, wherein the first portion comprises:
a first surface, the casing is configured to connect the electronic device at the first surface of the first portion; and
a second surface, the at least one shaft protrudes from the second surface of the first portion.

5. The protective shell as described in claim 1, wherein the second portion comprises:
a first surface, the casing is configured to connect the electronic device at the first surface of the second portion; and
a second surface, the at least one hook protrudes from the second joining end facing away from the first surface of the second portion and bends toward the second surface of the second portion.

6. The protective shell as described in claim 1, wherein the casing comprises:
a plate;
a first sidewall;
a second sidewall;
a third sidewall; and
a fourth sidewall;
wherein the first sidewall, the second sidewall, the third sidewall, and the fourth sidewall respectively protrude from side edges of the plate at a same surface, the first sidewall, the second sidewall, the third sidewall, the fourth sidewall, and the plate cooperatively form a receiving space to receive the electronic device.

7. The protective shell as described in claim 6, further comprising a frame, wherein:
the frame surrounds the receiving space and bends toward the receiving space, the frame is configured to prevent the electronic device from disengaging from the receiving space.

8. The protective shell as described in claim 1, wherein:
the second portion is cut off from the casing from two adjacent side edges, from one side edge of the casing toward an opposite side edge of the casing, or from an intermediate portion of the casing toward one of the side edges.

9. The protective shell as described in claim 1, wherein:
the first portion and the second portion are respectively independently formed;
a shape of the first joining end matches with a shape of the second joining end, the first portion cooperates with the second portion to form the integrative casing when the first joining end is jointed with the second joining end; and
the first joining end and the second joining end extend from one side edge of the casing toward an adjacent side edge of the casing, from one side edge of the casing toward an opposite side edge, or from an intermediate portion of the casing toward one of the side edges.

* * * * *